United States Patent [19]

Sasaki

[11] Patent Number: 5,305,329
[45] Date of Patent: Apr. 19, 1994

[54] DELAY DATA SETTING CIRCUIT AND METHOD

[75] Inventor: Yasushi Sasaki, Kumagaya, Japan

[73] Assignee: Advantest Corporation, Tokyo, Japan

[21] Appl. No.: 713,996

[22] Filed: May 31, 1991

[30] Foreign Application Priority Data

Jun. 8, 1990 [JP] Japan .................................. 2-150339

[51] Int. Cl.⁵ .......................................... G01R 31/28
[52] U.S. Cl. ..................................... 371/27; 371/22.1
[58] Field of Search ................. 365/201; 371/27, 15.1, 371/22.1

[56] References Cited

U.S. PATENT DOCUMENTS 4,493,079  1/1985  Hughes, Jr. .
4,692,920  9/1987  Tannhaeuser et al. ................ 371/27
4,730,318  3/1988  Bogholtz et al. ..................... 371/27

FOREIGN PATENT DOCUMENTS 0174409  3/1986  European Pat. Off. .
0322308  6/1989  European Pat. Off. .

Primary Examiner—Vincent P. Canney
Attorney, Agent, or Firm—Staas & Halsey

[57] ABSTRACT

Pins of an IC under test are classified into pin groups according to the delay time to be set for a test clock for each pin, and a table of pin group data, which has, at a bit position corresponding to each bit, a "1" "0" which indicates that the pin belongs to each pin group, is stored in a pin group table memory. The bit positions of the logical values "1", indicating that the pins belong to the pin group, in each pin group data read out from the pin group table memory are sequentially encoded by a priority encoder in an ascending (or descending) order and the delay data is provided to a delay data memory. The delay time data common to all the pins belonging to the pin group provided from a tester processor is written into sequentially specified addresses, by which the delay time data for all of the pins can be written into the delay data memory from the tester processor in a short time.

7 Claims, 5 Drawing Sheets

| PIN GROUP | PINS |
|---|---|
| G1 | P1, P2, P5, P10, P32 |
| G2 | P3, P8, P17, P29 |
| G3 | P4, P12, P27, P28 |
| G4 | P6, P7, P13, P18, P30 |
| G5 | P9, P15, P20, P21, P26 |
| G6 | P11, P14, P19, P23, P24 |
| G7 | P16, P22, P25, P31 |

FIG. 5

|    | P32 | P31 | P30 | P29 | P6 | P5 | P4 | P3 | P2 | P1 |
|----|-----|-----|-----|-----|----|----|----|----|----|----|
| G1 | 1 | 0 | 0 | 0 | 0 | 1 | 0 | 0 | 1 | 1 |
| G2 | 0 | 0 | 0 | 1 | 0 | 0 | 0 | 1 | 0 | 0 |
| G3 | 0 | 0 | 0 | 0 | 0 | 0 | 1 | 0 | 0 | 0 |
| G4 | 0 | 0 | 1 | 0 | 1 | 0 | 0 | 0 | 0 | 0 |
| G5 | 0 | 0 | 0 | 0 | 0 | 0 | 0 | 0 | 0 | 0 |
| G6 | 0 | 0 | 0 | 0 | 0 | 0 | 0 | 0 | 0 | 0 |
| G7 | 0 | 1 | 0 | 0 | 0 | 0 | 0 | 0 | 0 | 0 |

| INPUTS | | | | | | | | OUTPUTS | | | |
|---|---|---|---|---|---|---|---|---|---|---|---|
| $I_0$ | $I_1$ | $I_2$ | $I_3$ | $I_4$ | $I_5$ | $I_6$ | $I_7$ | $A_0$ | $A_1$ | $A_2$ | ES |
| 0 | 0 | 0 | 0 | 0 | 0 | 0 | 0 | 0 | 0 | 0 | 1 |
| × | × | × | × | × | × | × | 1 | 1 | 1 | 1 | 0 |
| × | × | × | × | × | × | 1 | 0 | 0 | 1 | 1 | 0 |
| × | × | × | × | × | 1 | 0 | 0 | 1 | 0 | 1 | 0 |
| × | × | × | × | 1 | 0 | 0 | 0 | 0 | 0 | 1 | 0 |
| × | × | × | 1 | 0 | 0 | 0 | 0 | 1 | 1 | 0 | 0 |
| × | × | 1 | 0 | 0 | 0 | 0 | 0 | 0 | 1 | 0 | 0 |
| × | 1 | 0 | 0 | 0 | 0 | 0 | 0 | 1 | 0 | 0 | 0 |
| 1 | 0 | 0 | 0 | 0 | 0 | 0 | 0 | 0 | 0 | 0 | 0 |

× : IMMATERIAL

DELAY DATA SETTING CIRCUIT AND METHOD

BACKGROUND OF THE INVENTION

The present invention relates to a delay data setting circuit and method whereby a delay time for a timing rate pulse of a test clock for each pin of an IC (a semiconductor integrated circuit) is set in a timing generator of an IC tester.

IC testers have been used for testing ICs to reject defective ICs or to analyze the defects in ICs. Such an IC tester generates test pattern data from a pattern generator, based on clocks from a timing generator, derives a signal waveform from pattern data contained in the test pattern data, based on the clocks from the timing generator, and converts the signal waveform into a signal voltage of an ECL or TTL level, which is supplied to corresponding one of pins of an IC under test. A response signal voltage obtained at each pin of the IC in this instance is subjected to a logical decision by comparison with a corresponding reference voltage and the logic thus decided is subjected to a logical comparison with expected value pattern data contained in the above-mentioned test pattern data, based on a clock from the timing generator. Thus it is necessary to obtain various test clocks from the timing generator.

The test clock is usually generated, based on a timing rate pulse, and the delay times of circuit elements and transmission lines to the IC tester are not always the same for each pin of the IC under test; therefore, test clocks for respective pins are set so that they are delayed for times $\tau_1, \tau_2, \ldots$ behind the timing rate pulse, respectively.

Conventionally, the setting of delay times is performed by a method which sequentially writes pieces of delay time data for respective pins into a delay data memory while sequentially specifying addresses therefor.

Figure 1:
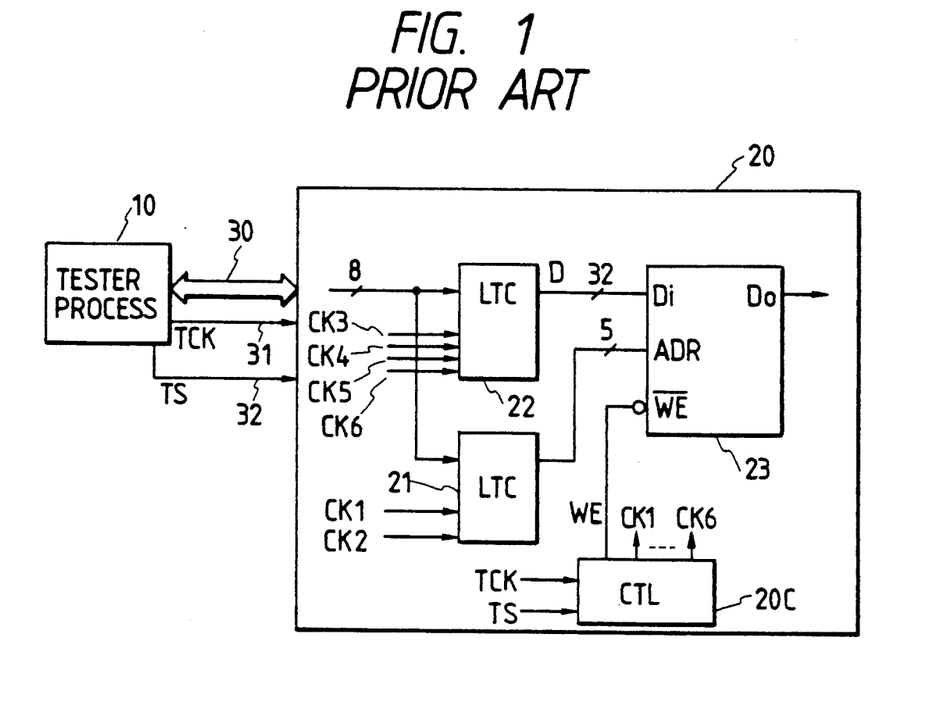
FIG. 1 is a block diagram showing an example of a conventional delay data setting circuit.

FIG. 1 shows an example of a device which implements the conventional setting method mentioned above. In this case, the number of pins of an IC (not shown) for which the delay times are to be set is 32 (hereinafter identified by P1, P2, P3, ..., P32) and the delay time data is 32-bit.

A tester processor 10 and a delay data setting circuit 20, which forms an interface of a timing generator, are interconnected via an 8-bit data bus 30, a clock line 31 and a control line 32, and the delay data setting circuit 20 includes latch circuits 21 and 22, a sequence control circuit 20C and a delay data memory 23. The latch circuit 21 is made up of, for example, two 8-bit latches, which fetch data from the data bus 30, based on interface clocks CK1 and CK2, respectively. The latch circuit 22 is made up of, for example, four 8-bit latches, which fetch data from the data bus 30, based on interface clocks CK3, CK4, CK5 and CK6, respectively. The sequence control circuit 20C responds to a test start signal TS from the tester processor 10 to generate, in synchronization with a tester clock TCK, the interface clocks CK1 through CK6 and a write enable signal WE in a predetermined sequential order at a predetermined timing. The delay data memory 23 is a memory in which delay time data of 32 bits can be written at each of $32 = 2^5$ addresses.

Figure 2:
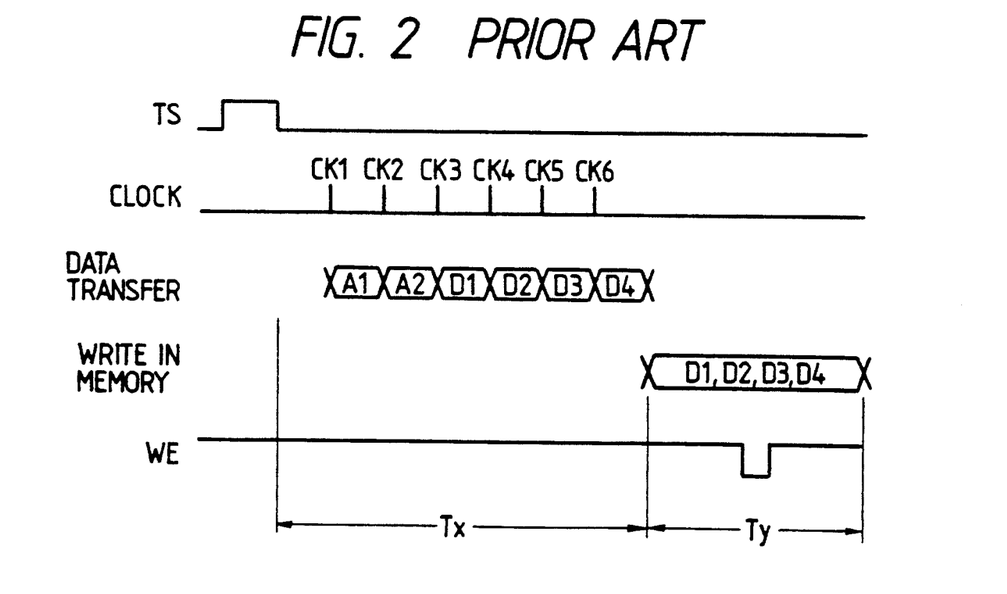
FIG. 2 is a timing chart for explaining the operation of the circuit depicted in FIG. 1.

As shown in FIG. 2, the sequence control circuit 20C responds to the test start signal TS to generate the interface clocks CK1 and CK2 in this order, by which 8-bit address data A1 and A2 from the tester processor 10 are sequentially fetched into the latch circuit 21. Of a total of 16 output bits from the latch circuit 21, five predetermined bits are provided, as address data for the pin P1, to an address terminal ADR of the delay data memory 23. The other output bits from the latch circuit 21 are used for the generation of a control signal in the delay data setting circuit 20, but this is a matter of design and hence will not be described. Next, delay time data of a total of 32 bits, for the pin P1, is transferred by the interface clocks CK1, CK2, CK3 and CK4, as 8-bit pieces of data D1, D2, D3 and D4 from the tester processor 10 to the latch circuit 22. The 32-bit delay time data is supplied to a data input terminal Di of the delay data memory 23. The time Tx for the transfer of the address data A1 and A2 and the delay time data D1 through D4 from the tester processor 10 to the delay data memory 23 will hereinafter be referred to as a data fetch period. After completion of the data fetch period Tx the 32-bit delay data for the pin P1 is written into the delay data memory 23 at the address corresponding to the pin P1, by the write enable signal WE which is applied from the sequence control circuit 20C to a write enable terminal $\overline{WE}$ of the delay data memory 23 at predetermined timing. The time for this write will hereinafter be referred to as a data write period Ty. After writing of the data for the pin P1 into the memory 23, the tester processor 10 sends out the address data A1 and A2 and the delay time data D1 through D4 for the pin P2, which are fetched into the latch circuits 21 and 22 by the interface clocks CK1 and CK2 and CK3 through CK6, respectively, and the delay time data thus fetched is written by the write enable signal WE into the memory 23 at the address corresponding to the pin P2. Thereafter pieces of delay time data for the pins P3, ..., P32 are similarly written into the delay data memory 23 at the addresses corresponding thereto.

Though not shown, the pieces of delay time data for the pins P1, P2, P3, ..., P32, thus written into the delay data memory 23, are read out therefrom at its data output terminal Do. Based on the delay time data, test clocks for the pins P1, P2, P3, ..., P32 are generated.

However, the above-described conventional method sequentially writes the pieces of delay time data for respective pins into the delay data memory 23 while sequentially specifying the addresses therefor, and hence takes much time for setting the delay time. Letting the time for fetching the address data and the delay time data from the tester processor 10 into the latch circuits 21 and 22 for each pin, the time for writing the delay time data into the delay data memory 23 for each pin and the total number of pins for which the delay times are to be set are represented by Tx, Ty and N, respectively, a period of time, $N(Tx+Ty)$, is needed for setting the delay times in the memory 23 for all the pins.

SUMMARY OF THE INVENTION

It is therefore an object of the present invention to provide a delay data setting circuit and method whereby data on the delay time of the test clock relative to the timing rate pulse, for each pin of an IC under test, can be set in the timing generator of an IC tester in a short time.

According to the present invention, pins of an IC under test are classified into pin groups according to the delay time to be set for a test clock for each pin, and a table of data, which indicates whether or not each pin belongs to each of the pin groups, is prestored in a pin group table memory. Then, the data indicating whether each pin of each pin groups belongs to the pin group is read out from the pin group table memory for each pin group, and for each pin group, addresses corresponding to the pins belonging to the pin group are sequentially specified by address generating means and the delay time data common to all the pins belonging to the pin group is written into the delay data memory.

Thus, according to the present invention, only one piece of delay time data common to each pin group needs to be transferred from the tester processor and the data transfer time is reduced accordingly. This affords reduction of the time for setting the delay time data in the delay data memory for all the pins of the IC under

DESCRIPTION OF THE PREFERRED EMBODIMENT

Figure 3:
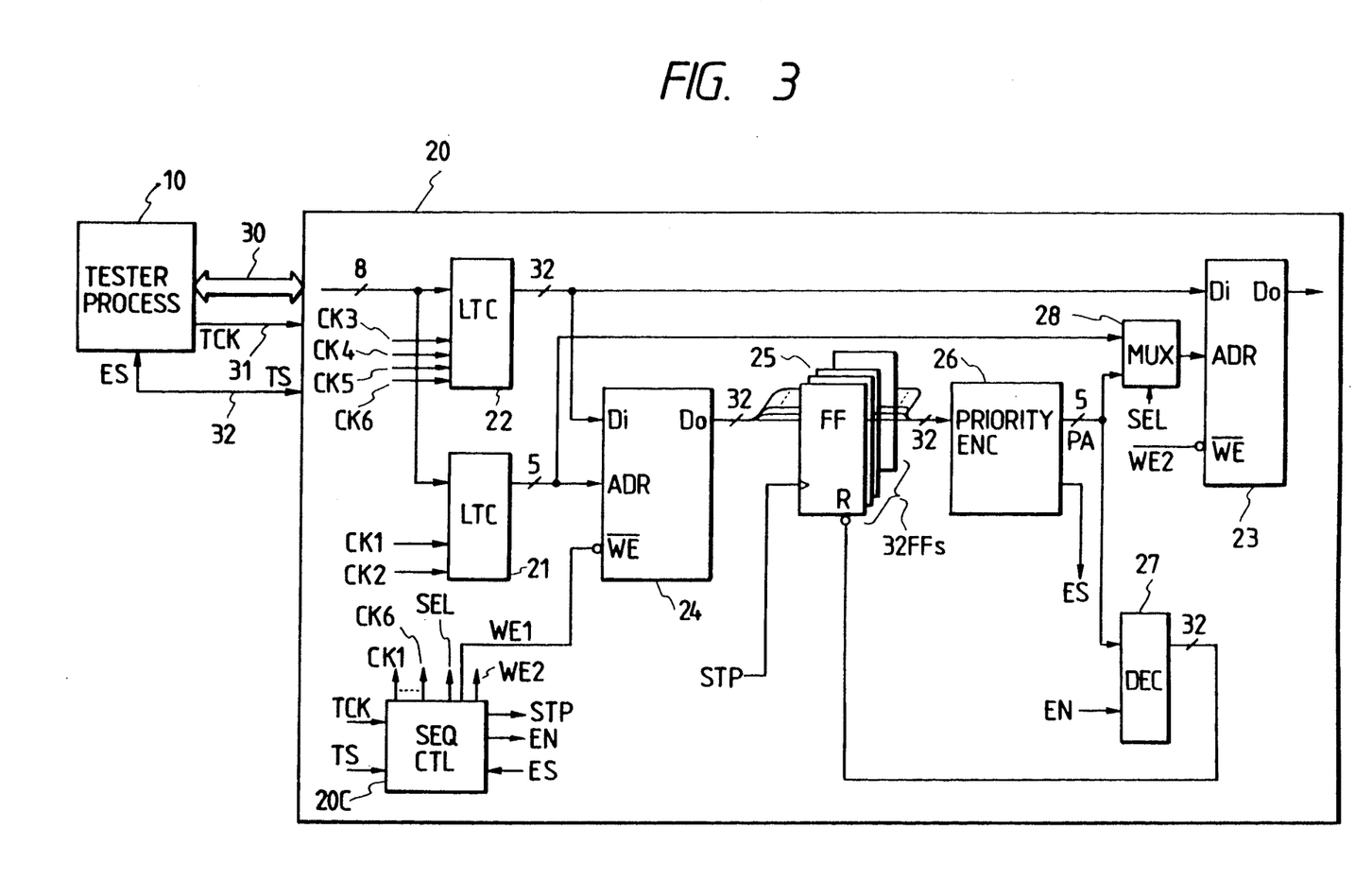
FIG. 3 is a block diagram illustrating an embodiment of the present invention.

FIG. 3 is a block diagram of an example of a device embodying the setting method of the present invention. In this instance, the total number of pins of an IC for which the afore-mentioned delay time data is to be set is 32 (hereinafter identified by P1, P2, P3, . . . , P32) and each delay time data is 32-bit.

The tester processor 10 and the delay data setting circuit 20 are interconnected via an 8-bit data bus 30, the clock line 31 and the control line 32. The delay data setting circuit 20 includes the sequence control circuit 20C, the latch circuits 21 and 22, the delay data memory 23, a pin group table memory 24, a flip-flop group 25 composed of 32 flip-flops, a priority encoder 26, a decoder 27 and a multiplexer 28. In the operation for writing the delay time data into the delay time data memory 23 as described below, the multiplexer always responds to a select signal SEL from the sequence control circuit 20C to select and apply the output of the priority encoder 26 to the address terminal ADR of the delay data memory 23. The delay data memory can write thereinto 32-bit delay time data at each of its $32=2^5$ addresses. The pin group table memory 24 can store a pin group table described later on. The flip-flop group 25 is made up of 32 flip-flops.

Figure 4:
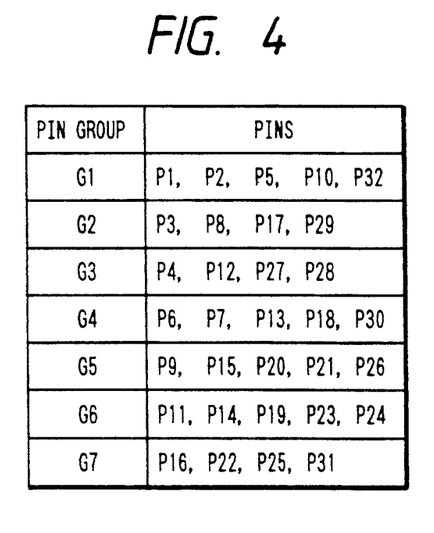
FIG. 4 is a table showing an example of pin groups.

The delay time of the test clock relative to the timing rate pulse does not always differ with respective pins of the IC, but in practice, there are usually pin groups for each of which the same delay time should be set. This will be described, by way of example, in connection with the case where the same delay time is set for the pins P1, P2, P5, P10 and P32; the same delay time is set for the pins P3, P8, P17 and P29; the same delay time is set for the pins P4, P12, P27 and P28; the same delay time is set for the pins P6, P7, P13, P18 and P30; the same delay time is set for the pins P9, P15, P20, P21 and P26; the same delay time is set for the pins P11, P14, P19, P23 and P24; and the same delay time is set for the pins P16, P22, P25 and P31. In this instance, the relationship between the pin groups and the pins classified by the delay times of the test clocks relative to the timing rate pulse is such as depicted in FIG. 4.

Figure 5:
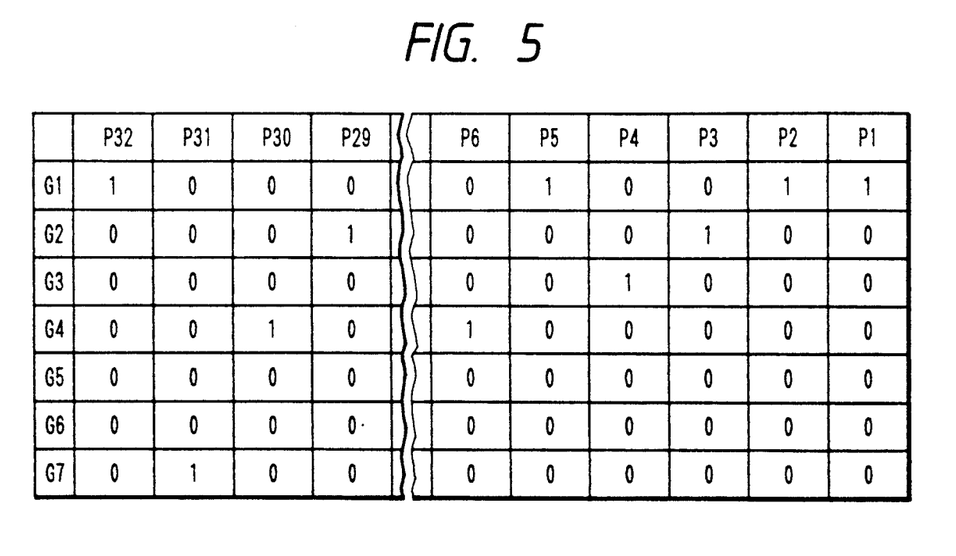
FIG. 5 is a diagram showing an example of a pin group data table which is stored in a pin group table memory.

According to the present invention, 32-bit data indicating whether or not each of the pins P1 through P32 belongs to each pin group is produced for each pin group as shown in FIG. 5, and such a pin group data table is loaded in the pin group table memory 24 from the tester processor 10. The sequence therefor is the same as that for the setting of the delay time data described previously with respect to FIG. 1, and hence it will be described with reference to the timing chart of FIG. 2. When supplied with the test start signal TS from the tester processor 10, the sequence control circuit 20C produces the interface clocks CK1 and CK2 in synchronization with the tester clock TCK and the pieces of address data A1 and A2 which are transferred from the tester processor 10 in 8-bit groups are latched by the clocks CK1 and CK2 in the latch circuit 21. Of a total of 16 bits of the address data, five bits are provided as address data for the pin group G1 to an address terminal ADR of the pin group table memory 24.

Next, the pieces of data D1 through D4 which are transferred from the tester processor 10 to the latch circuit 22 in 8-bit groups are fetched by the interface clocks CK3, CK4, CK5 and CK6 into the latch circuit 22. The pieces of data D1 through D4 of a total of 32 bits indicate whether or not each of the pins P1 through P32 belongs to the pin group G1. In FIG. 5 data "1" in each of the pin groups G1 to G7 indicates that the corresponding pin belongs to the group. The 32-bit data is supplied from the latch circuit 22 to a data input terminal Di of the pin group table memory 24, and in response to a write enable signal WE1, the pin group data is written into the address corresponding to the pin group G1. Thereafter 32-bit pin group data indicating whether each of the pins P1 through P32 belongs to each of the pin groups G2, G3, . . . , G32 is similarly written into the pin group table memory 24 at the address corresponding to each pin group.

Now, let the time necessary for fetching the pieces of address data A1 and A2 of the pin group table memory 24 and the pieces of pin group data D1 through D4 indicating whether or not the pins P1 through P32 belong to a certain pin group into the latch circuits 21 and 22 from the tester processor 10 be represented by Tx and let the time for writing into the pin group table memory 24 the pin group data on the pin group latched in the latch circuit 22 be represented by Ty. In the example shown in FIG. 5, since the total number M of the pin groups is seven, the time for storing the data table depicted in FIG. 5 into the pin group table memory 24 is 7(Tx+Ty).

Figure 6:
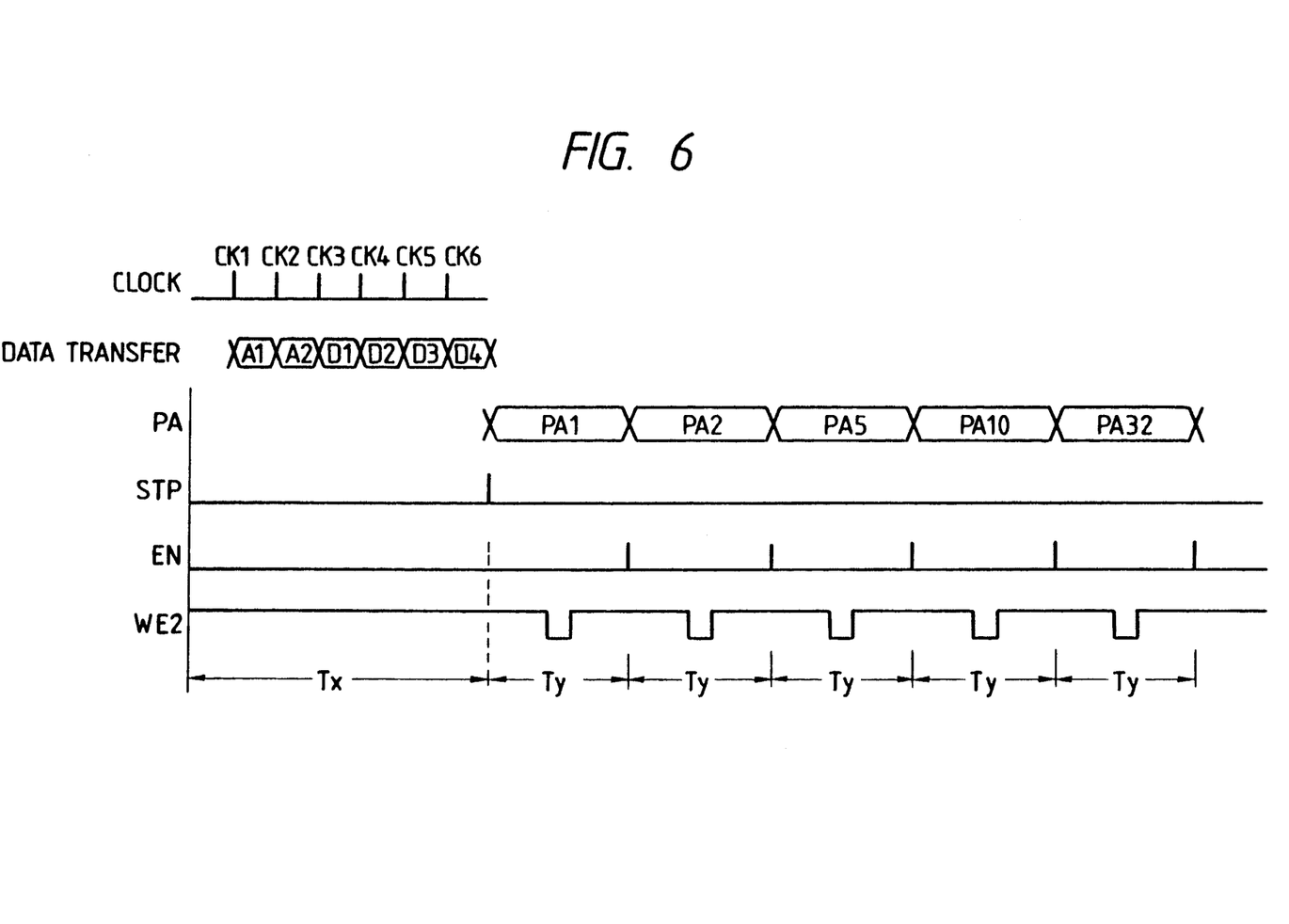
FIG. 6 is a timing chart for explaining the operation of the embodiment illustrated in FIG. 3.

Next, a description will be given, with reference to FIG. 6, of an operation by which delay data for each of the pins P1 to P32 is set in the delay data memory 23. As shown in FIG. 6, the pieces of address data A1 and A2, each 8-bit, which are transferred from the tester processor 10 to the latch circuit 21, are latched by the interface clocks CK1 and CK2 into the latch circuit 21. Of the total of 16 bits, five bits are supplied, as address data for the pin group G1, to the address terminal ADR of the pin group table memory 24, from which the 32-bit pin group data indicating whether or not each of the pins P1 through P32 belongs to the pin group G1, stored at the address for the pin group G1, is read out via a data output terminal Do, and the pin group data thus read out is set by a set pulse STP in the flip-flop group 25. Next, the pieces of delay time data D1 through D4 of a total of 32 bits common to all of the pins P1, P2, P5, P10 and P32 belonging to the pin group P1, which are transferred from the tester processor 10 in 8-bit groups, are sequentially fetched by the interface clocks CK3, CK4, CK5 and CK6 into the latch circuit 22 in 8-bit groups. The delay time data is then supplied to the data input terminal Di of the delay data memory 23. Following this, the bit position of a "1" which is the least significant in the 32-bit pin group data of the pin group G1 set in the flip-flop group 25 is detected in the priority encoder 26 and 5-bit pin address data PA1 which specifies the pin corresponding to the detected bit position, i.e. the pin P1 in the example of FIG. 5, is produced. This 5-bit pin address data PA1 is provided as address data PA to the address terminal ADR of the delay data memory 23 via the multiplexer 28. By supplying of a write enable signal WE2 to the write enable terminal $\overline{WE}$ of the delay data memory 23 from the sequence control circuit 20C, the 32-bit delay time data common to all the pins belonging to the pin group G1 is written into the address PA1 of the delay data memory 23.

Next, an enable signal EN is applied from the sequence control circuit 20C to the decoder 27, by which the 5-bit address data PA (PA1 in this case) from the priority encoder 26 is decoded into 32-bit data which contains a "1" only at the bit position corresponding to the pin P1 and all "0s" at the other bit positions. By the supply of the 32-bit data to reset terminals R of the 32 flip-flops of the flip-flop group 25, the content of only the flip-flop which has set therein the least significant bit "1" in the 32-bit data set in the flip-flop group 25, as mentioned above, is changed to a "0". Consequently, the next least significant bit having the "1" in the pin group data of the pin group G1 is at the bit position corresponding to the pin P2. Based on this, the priority encoder 26 produces 5-bit pin address data PA2 corresponding to the pin P2 and provides it to the address terminal ADR of the delay data memory 23. When the write enable signal WE2 is applied again from the sequence control circuit 20C, the 32-bit delay time data common to the group G1, provided from the latch circuit 22, is written into the memory 23 at the address corresponding to the pin P2. Thereafter, pieces of pin address data PA5, PA10 and PA32 are sequentially produced in connection with the other pins P5, P10 and P32 belonging to the pin group G1 and the pieces of delay time data common to the group G1 are sequentially written into the delay data memory 23 at addresses PA5, PA10 and PA32. Thus, all the bits of the data set in the flip-flop group 25 go to "0" and then the priority encoder 26 outputs an end signal ES.

Upon receiving the end signal ES, the sequence control circuit 20C transfers it to the tester processor 10. When supplied with the end signal ES, the tester processor 10 transfers 16-bit data containing an address specifying the pin group G2, to the latch circuit 21 in 8-bit groups and then transfers 32-bit delay time data common to the pin group G2 to the latch circuit 22 in 8-bit groups. As is the case with the pin group G1, the delay time data is written into the delay time data memory 23 at each of the addresses corresponding to the pins P3, P8, P17 and P28 belonging to the pin group G2. Thereafter delay time data common to each of the groups G3, G4, . . . , G7 is likewise written into the delay data memory 23 at an address corresponding to each pin belonging to the pin group.

Figure 7:
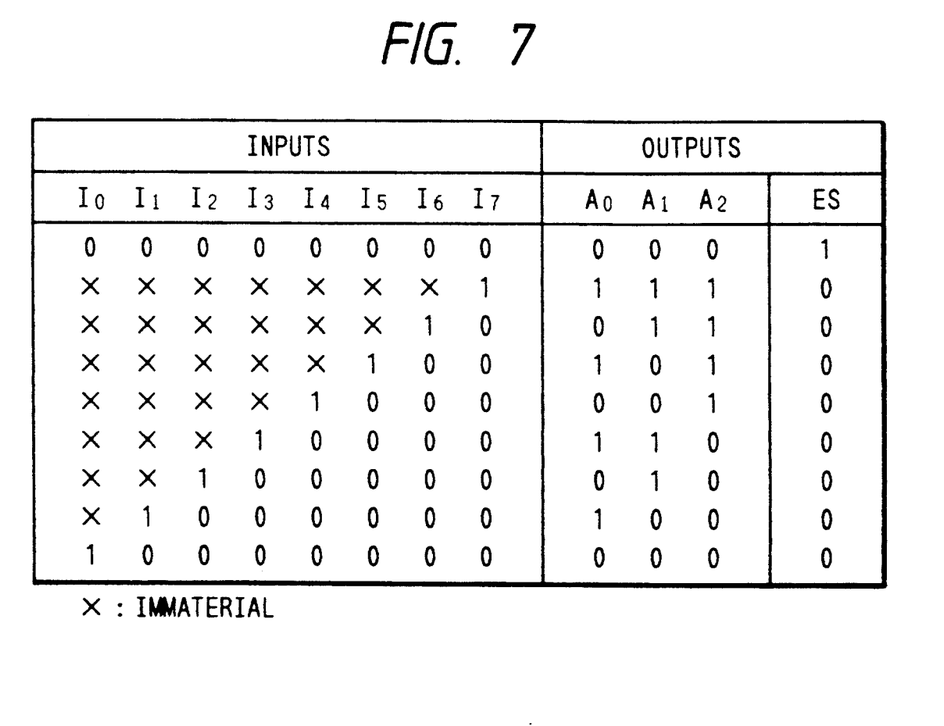
FIG. 7 is a truth value table for explaining the operation of a priority encoder.

While in the above the priority encoder 26 has been described to detect the bit position of the least significant bit "1" in the 32-bit pin group data, it is evident that the priority encoder 26 may also be used to detect the bit position of the most significant bit "1" in the 32-bit data. The priority encoder 26 has such an encoding function as shown in a truth value table of FIG. 7 which shows, for the sake of brevity, the case where it has an 8-bit input and a 3-bit output. In FIG. 7 "X" may assume either a "0" or "1". The priority encoder 26 is used to detect the bit position of the most significant bit "1" in this truth value table and encode the bit. The output ES of the priority encoder 26 goes to a "1" only when all the input bits are "0", and this output can be utilized as the end signal ES in FIG. 3. Such a priority encoder is commercially available, for example, as 54F/74F which is an IC by National Semiconductor Inc. and it is easy for those skilled in the art to combine four such ICs to implement the priority encoder with the 32-bit input and the 5-bit output in the FIG. 3 embodiment.

Now, let the time for fetching address data of the pin group table memory 24 and the delay time data common to each pin of a certain pin group into the latch circuits 21 and 22 from the tester processor 10 be represented by Tx and the time for writing the delay time data into the delay data memory 23 for each pin be represented by Ty. In this instance, since the total number N of the pins for which the delay time data is set to 32 and since the total number M of the pin groups is seven, the time necessary for setting the delay time data for all the pins after a data table as depicted in FIG. 5 is loaded in the pin group table memory 24 is 7T+32 Ty. Assuming that the time for loading the data table in the pin group table memory 24 is 7(Tx+Ty) as mentioned above, the time T for setting the delay time data for all the pins, including the time for loading the data table in the pin group table memory 24, becomes as follows:

$$T = 7(Tx + Ty) + 7Tx + 32Ty \quad (1)$$
$$= 14Tx + 39Ty$$

Incidentally, it is evident that, for arbitrary numbers M and N of pin groups and pins, Eq. (1) becomes as follows:

$$T = 2M \cdot Tx + (M+N) \quad (2)$$

In concrete terms, assuming that Tx and Ty are 700 and 300 ns, respectively, the time for setting the delay time data for all the pins is 21,500 ns in the above-described embodiment of the invention. Since the time N(Tx+Ty) needed by the conventional setting method described previously with respect to FIGS. 1 and 2 is 32,000 ns, the method of the invention affords appreciable reduction of time. With an increase in the number of pins of an IC, the total number N of pins for which to set the delay time, in practice, is appreciably larger than 32. Therefore the present invention permits the setting of the delay time in a markedly shorter time than is needed in the prior art.

To read out the delay time data for each pin set in the delay data memory 23 as mentioned above for setting the delay time for each pin, the select signal SEL is applied from the sequence control circuit 20C to the multiplexer 28 so that the latter selects the output of the latch circuit 21—though this is not related directly to the invention. Next, 16-bit data containing address data is provided from the tester processor 10 to the latch circuit 21 in 8-bit groups. Five bits of the eight bits are provided as an address to the delay data memory 23 via the multiplexer 28, from which the delay time data for the corresponding pin is read out. By repeating such operations, the delay time data for all the pins is read out.

As described above, according to the present invention, the delay time data of the test clock relative to the timing rate pulse for each pin of an IC under test can be set in the timing generator of the IC tester in a short time.

What is claimed is:

1. A method whereby delay time data for setting a delay time of a test clock for each pin of an IC under test to a desired value is set in a delay data memory from a testor processor, said method comprising the steps of:
   a) prestoring in a pin group table memory pin group data, the table of pin group data indicating whether or not each pin belongs to respective ones of a plurality of pin groups, the pins being grouped according to respective delay times set therein;
   b) reading out pin group data from the pin group table memory for each pin group, addresses only for pins belonging to each pin group are sequentially specified, based on the pin group data read out of the pin group table memory; and
   c) writing data of the delay time common to the pins belonging to the pin group into the delay data memory.

2. The method of claim 1, wherein said step c) of writing the delay time data into the delay data memory comprises the substeps of:
   i) transferring common delay time data from the tester processor to latch means and holding the common delay time data therein; and
   ii) writing the common delay time data held in the latch means into the sequentially specified addresses of the delay data memory.

3. The method of claim 1, wherein the pin group data of each of the pin groups is data which has, at a bit position corresponding to each of the pins of the IC under test, a logical value "1" or "0" indicating whether or not each pin belongs to each pin group.

4. The method of claim 3, wherein said step b) sequentially generating addresses corresponding to said pins belonging to said each comprises the substeps of:
   a) setting the pin group data read out from the pin group table memory into a flip-flop group;
   b) generating an address of a pin corresponding to a bit position of a logical value which is on either one of the most significant side and the least significant side of the pin group data set in the flip-flop group and indicating that the corresponding pin belongs to the pin group; and
   c) writing the common delay time data is the address and then inverting the logical value of one of the flip-flops of the flip-flop group which corresponds to the address.

5. A delay data setting circuit wherein delay time data of a test clock for each pin of an IC under test is transferred from a tester processor and is written into a memory, said circuit comprising:
   a pin group table memory for storing a table of pin group data in which data for each pin group has, at each bit position thereof corresponding to one of the pins, a logical value "1" or "0" indicating whether or not said one of the pins belongs to each said pin group, the pins being grouped according to respective delay times set therein;
   pin address generating means, bit positions of logical values indicating that the pins belong to a certain pin group are sequentially detected in each pin group data read out of said pin group table memory and addresses of pins corresponding to said detected bit positions are generated; and
   delay data memory means for writing said delay time data thereinto common to the pin group transferred from the tester processor at an address generated by said pin address generating means and corresponding to each of the pins belonging to the pin group.

6. The delay data setting circuit of claim 5, further comprising:
   first latch means for fetching address data transferred from said tester processor to specify addresses of said pin group table memory; and
   second latch means for fetching said pin group data transferred from said tester processor during writing to said pin group table memory and for fetching said delay data common to said pins belonging to each pin group transferred from said tester processor during writing to said delay data memory.

7. The delay data setting circuit of claim 5, wherein said pin address generating means comprises:
   a flip-flop group made up of a plurality of flip-flops in which logical values of respective bits of said pin group data read from said pin group data memory are set, respectively;
   a priority encoder receiving said pin group data set in said flip-flop groups and outputting a pin address of pin corresponding to the bit position of a logical value which is on either one of the most significant side and the least significant side in said pin group data and indicates that the corresponding pin belongs to said pin group; and
   inverting means for inverting the logical value of one of said flip-flops in said flip-flop group which corresponds to said output pin address.

* * * * *

UNITED STATES PATENT AND TRADEMARK OFFICE
CERTIFICATE OF CORRECTION

PATENT NO. : 5,305,329
DATED : April 19, 1994
INVENTOR(S) : YASUSHI SASAKI

It is certified that error appears in the above-indentified patent and that said Letters Patent is hereby corrected as shown below:

Item: [57], col. 2,
 Title page, (ABSTRACT), line 4, after "1" insert --or--.

Col. 3, line 14, after "under" insert --test.--;
    line 49, after "multiplexer" insert --28--;
    line 53, after "memory" insert --23--.

Col. 5, line 20, delete "of".

Col. 6, line 35, "7T" should be --7Tx--.

Col. 7, line 20, "testor" should be --tester--;
    lines 48-50, delete "sequentially....each".

Col. 8, line 3, "is" should be --in--;
    line 48, after "of" insert --a--.

Signed and Sealed this

Eleventh Day of October, 1994

*Attest:*

BRUCE LEHMAN

*Attesting Officer*   *Commissioner of Patents and Trademarks*